(12) United States Patent
Lake

(10) Patent No.: US 7,888,758 B2
(45) Date of Patent: Feb. 15, 2011

(54) METHOD OF FORMING A PERMANENT CARRIER AND SPACER WAFER FOR WAFER LEVEL OPTICS AND ASSOCIATED STRUCTURE

(75) Inventor: Rickie C. Lake, Meridian, ID (US)

(73) Assignee: Aptina Imaging Corporation, George Town (KY)

( * ) Notice: Subject to any disclaimer, the term of this patent is extended or adjusted under 35 U.S.C. 154(b) by 400 days.

(21) Appl. No.: 12/073,998

(22) Filed: Mar. 12, 2008

(65) Prior Publication Data

US 2009/0231826 A1    Sep. 17, 2009

(51) Int. Cl.
*H01L 31/00* (2006.01)

(52) U.S. Cl. ............... 257/433; 257/431; 257/E31.127

(58) Field of Classification Search .................. 361/820; 438/65; 257/E31.122, 431, 433, 443, 432, 257/292, 444, 460
See application file for complete search history.

(56) References Cited

U.S. PATENT DOCUMENTS

| | | | |
|---|---|---|---|
| 5,047,117 A * | 9/1991 | Roberts | 438/424 |
| 6,759,266 B1 * | 7/2004 | Hoffman | 438/64 |
| 6,908,201 B2 | 6/2005 | Gudeman et al. | |
| 6,953,925 B2 | 10/2005 | Fang et al. | |
| 7,223,626 B2 | 5/2007 | Farnworth et al. | |
| 7,235,431 B2 | 6/2007 | Wood et al. | |
| 7,247,509 B2 * | 7/2007 | Yamauchi et al. | 438/33 |
| 7,723,741 B2 * | 5/2010 | Farnworth et al. | 257/98 |
| 2004/0055151 A1 | 3/2004 | Obi et al. | |
| 2005/0023656 A1 | 2/2005 | Leedy | |
| 2005/0085016 A1 | 4/2005 | McWilliams et al. | |
| 2005/0205954 A1 | 9/2005 | King et al. | |
| 2005/0208702 A1 | 9/2005 | Kim | |
| 2005/0208704 A1 | 9/2005 | Akram et al. | |
| 2006/0035415 A1 | 2/2006 | Wood et al. | |
| 2006/0046347 A1 | 3/2006 | Wood et al. | |
| 2006/0157274 A1 | 7/2006 | Stark | |
| 2006/0263931 A1 | 11/2006 | McClure et al. | |
| 2007/0001247 A1 | 1/2007 | Patel et al. | |
| 2007/0042530 A1 | 2/2007 | Kim et al. | |
| 2007/0158787 A1 | 7/2007 | Chanchani | |
| 2007/0170360 A1 | 7/2007 | Gooch et al. | |
| 2007/0231943 A1 | 10/2007 | Ouellet et al. | |
| 2007/0259463 A1 | 11/2007 | Abedini | |
| 2008/0012095 A1 | 1/2008 | Lee et al. | |
| 2009/0061598 A1 * | 3/2009 | Tsai et al. | 438/462 |

FOREIGN PATENT DOCUMENTS

EP    1 389 804 A2    2/2007

(Continued)

OTHER PUBLICATIONS

Ganesh, V.P. et al., "Assembly Technology Development for 3D Silicon Stacked Module for Handheld Products", Electronic Components and Technology Conference, pp. 1300-1307, May 30-Jun. 2, 2006.

(Continued)

*Primary Examiner*—Roy K Potter

(57) ABSTRACT

A carrier wafer for wafer level fabrication of imager structures comprising a substrate with trenches corresponding to locations of imager arrays on an imager wafer. A method of fabricating such a carrier wafer and a method of fabricating an imager module employing such a carrier wafer are also provided.

25 Claims, 10 Drawing Sheets

FOREIGN PATENT DOCUMENTS

| | | |
|---|---|---|
| JP | 2005-117011 | 4/2005 |
| WO | WO 02/27363 A2 | 4/2002 |
| WO | WO 2006/090650 A1 | 8/2006 |
| WO | WO 2007/001524 A1 | 1/2007 |

OTHER PUBLICATIONS

El Gamal, Abbas et al., "CMOS Image Sensors", Circuits and Devices Magazine, IEEE, vol. 21, Issue 3, pp. 6-20, May-Jun. 2005.

Tseng, Berry Hsien Jen et al., "Characterization and Control of Microcontamination for Advanced Technology Nodes and 300-mm Wafer Processing: Overview and Challenges", IEEE Transactions on Device and Materials Reliability, vol. 5, Issue 4, pp. 623-630, Dec. 2005.

Moslehi, Mehrdad M. et al., "Single-Wafer Integrated Semiconductor Device Processing", IEEE Transactions on Electron Devices, vol. 39, Issue 1, pp. 4-32, Jan. 1992.

* cited by examiner

METHOD OF FORMING A PERMANENT CARRIER AND SPACER WAFER FOR WAFER LEVEL OPTICS AND ASSOCIATED STRUCTURE

FIELD OF THE INVENTION

Embodiments of the invention relate to microelectronic imagers and wafer level optics, and in particular to the fabrication of permanent carrier wafers and spacer wafers.

BACKGROUND

Microelectronic imagers are used in digital cameras, wireless devices with picture-taking capabilities, and many other applications. Mobile phones and personal digital assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that typically use charged coupled device (CCD) systems and complementary metal-oxide semiconductor (CMOS) systems, as well as other systems. CCD image sensors have been widely used in digital cameras and other applications. CMOS image sensors are also quickly becoming very popular because they have low production costs, high yields, and small sizes.

The microelectronic imagers are often fabricated, at a wafer level, to form part of an imager module 100, shown in FIG. 1. The imager module 100 includes an imager die 112, which includes an imager array 111 on an imager substrate 110. The imager array 111 may be a CCD or CMOS imager array, or any other type of imager array. The imager module 100 also includes a lens stack 120, which includes at least one lens element 121 with at least one corresponding spacer wafer 122. The spacer wafer 122 maintains the lens element 121 at a proper distance from the imager array 111, such that a desired amount of light striking the convex side of the lens element 121 is directed through an aperture 140 to the imager array 111. The lens stack 120 may be bonded to the imager die 110 by a bonding material 123 such as epoxy.

During wafer level module fabrication processes, it is necessary to protect the imager array 111 from damage. A carrier wafer can be used for this purpose.

In practice, imager modules such as the imager module 100 shown in FIG. 1 may be fabricated in mass rather than individually. Thus, as shown in FIG. 2, multiple imager dies, each die including a respective imager array 211 and a substrate 210, are contained on an imager wafer 200. The imager wafer 200 contains multiple imager arrays 211, 211', 211", and the imager substrate 210 of the imager wafer 200 is the substrate for the multiple imager dies. During fabrication, backside processes can be conducted substantially concurrently on each imager die on the imager wafer 200. Such backside processes may include, but are not limited to, thinning of the imager substrate 210 and providing redistribution lines (RDL) (not shown).

As shown in FIG. 1, the imager module 100 has an aperture 140 to expose the imager array 111 to light focused by the lens element 121. During wafer level module fabrication, however, leaving the imager array 111 exposed can cause damage or contamination to the imager array 111. Accordingly, in practice the imager arrays 211 on the imager wafer 200 are protected by a carrier wafer 300 (FIG. 3A) that is bonded to the imager wafer 200. The carrier wafer 300 has cavities 312 corresponding to the locations of the imager arrays 211 on the imager wafer 200.

A portion of the carrier wafer 300 bonded to the imager wafer 200 is shown in FIG. 3B, which illustrates a single etched-area 311 of the carrier wafer 300 and the corresponding single imager array 211 and associated imager substrate 210 of the imager wafer 200. The imager wafer 200 and carrier wafer 300 are shown bonded together with a bonding material 123, such as epoxy.

Once backside processing of the imager wafer 200 is complete, the carrier wafer 300 is thinned to open the cavities 312 and expose the imager arrays 211. The dashed line in FIG. 3B indicates an example level for thinning the carrier substrate 310. The portions of the carrier wafer which remain at each etched-area 311 after thinning form spacer wafers 122 (FIG. 1).

While the carrier wafer 300 provides some protection for the imager array 211 during the fabrication process, the carrier wafer 300 does not provide protection to the imager array 211 while the carrier wafer 300 itself is being thinned. As the carrier wafer 300 is being thinned to expose the cavity 312, such as through a grinding process, silicon particles and grind residues can contaminate the imager array 211. Accordingly, there is a need and desire for an efficient method of fabricating a carrier wafer that provides protection for the imager arrays of an imager wafer during the fabrication process.

DETAILED DESCRIPTION OF THE INVENTION

In the following detailed description, reference is made to the accompanying drawings which form a part hereof, and in which are shown by way of illustration specific embodiments that may be practiced. It should be understood that like reference numbers represent like elements throughout the drawings. These example embodiments are described in sufficient detail to enable those skilled in the art to practice them. It is to be understood that other embodiments may be utilized, and that structural, material, and electrical changes may be made, only some of which are discussed in detail below.

In several of the figures discussed below, the formation of a single imager die with permanent carrier wafer is detailed for purposes of simplicity in describing the process. It should be understood that, in practice, the apparatuses and methods described herein are used to form numerous imager dies and associated modules. Thus, the figures are representative of a single imager die amongst a plurality of imager dies, as typically would be true in wafer level fabrication.

Figure 4A:
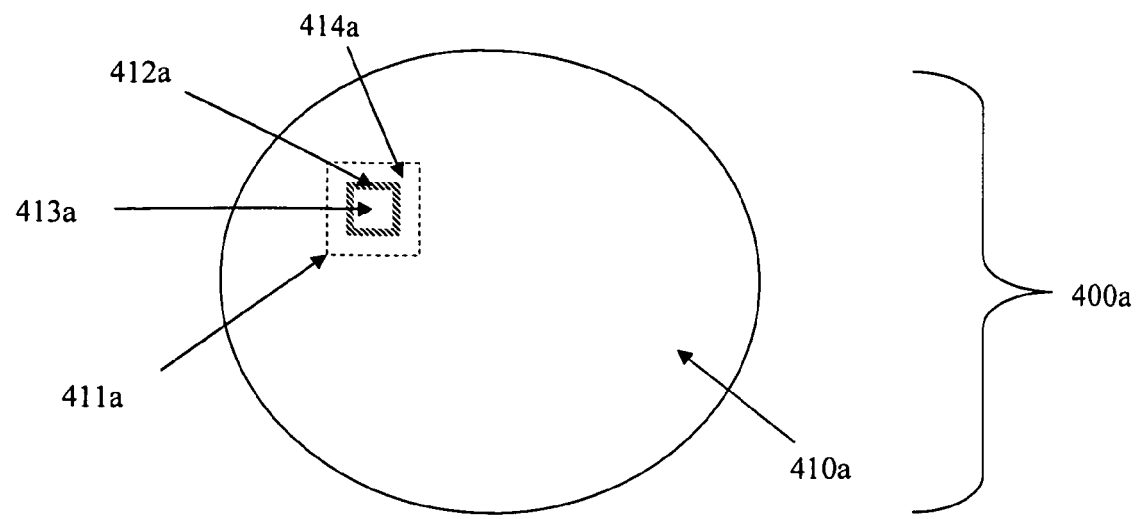
FIGS. 4A-4B show examples of etched carrier wafers constructed in accordance with embodiments described herein.
Figure 4B:
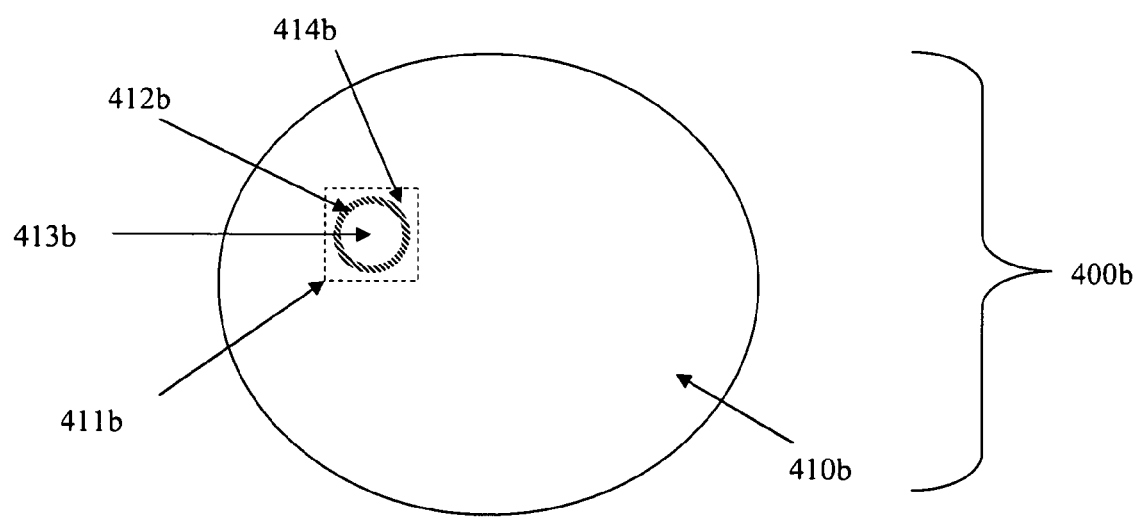

FIGS. 4A-4B illustrate examples of etched carrier wafers 400a, 400b, in accordance with embodiments described herein. The illustrated etched carrier wafers 400a, 400b each include a plurality of etched areas 411a, 411b. For purposes of clarity in describing the methods and structures herein, only a single etched area 411a, 411b in each etched carrier wafer 400a, 400b is shown here. In practice, however, it should be understood that a carrier wafer will correspond to an imager wafer containing multiple imager arrays. Thus, in practice, etched carrier wafers 400a, 400b will commonly have multiple etched areas 411a, 411b at locations which can be aligned with locations of imager dies on an imager wafer.

FIG. 4A illustrates an etched carrier wafer 400a that includes an etched area 411a in a carrier substrate 410a. The etched area 411a features a rectangular-shaped trench 412a that forms a perimeter encompassing an inner area 413a. The trench 412a is surrounded by an outer area 414a. The inner area 413a corresponds to a location of an imager array on a corresponding imager wafer.

Similarly, FIG. 4B illustrates another etched carrier wafer 400b. The etched carrier wafer 400b also includes an etched area 411b in the carrier substrate 410b. Here, the etched area 411b features a circular-shaped trench 412b. The circular inner area 413b also corresponds to one of a plurality of locations of imager arrays on an imager wafer, and is surrounded by an outer area 414b. Each etched area 411a, 411b of the illustrated embodiments of the carrier wafers 400a, 400b retains a majority of the volume of the carrier substrate 410a, 410b within the trench 412a, 412b during the processing described below.

While FIGS. 4A-4B show two particular examples of embodiments of an etched carrier wafer, as described herein, other embodiments may be used which include any etched area where a trench is etched to define a perimeter around an area corresponding to an imager array.

Figure 5:
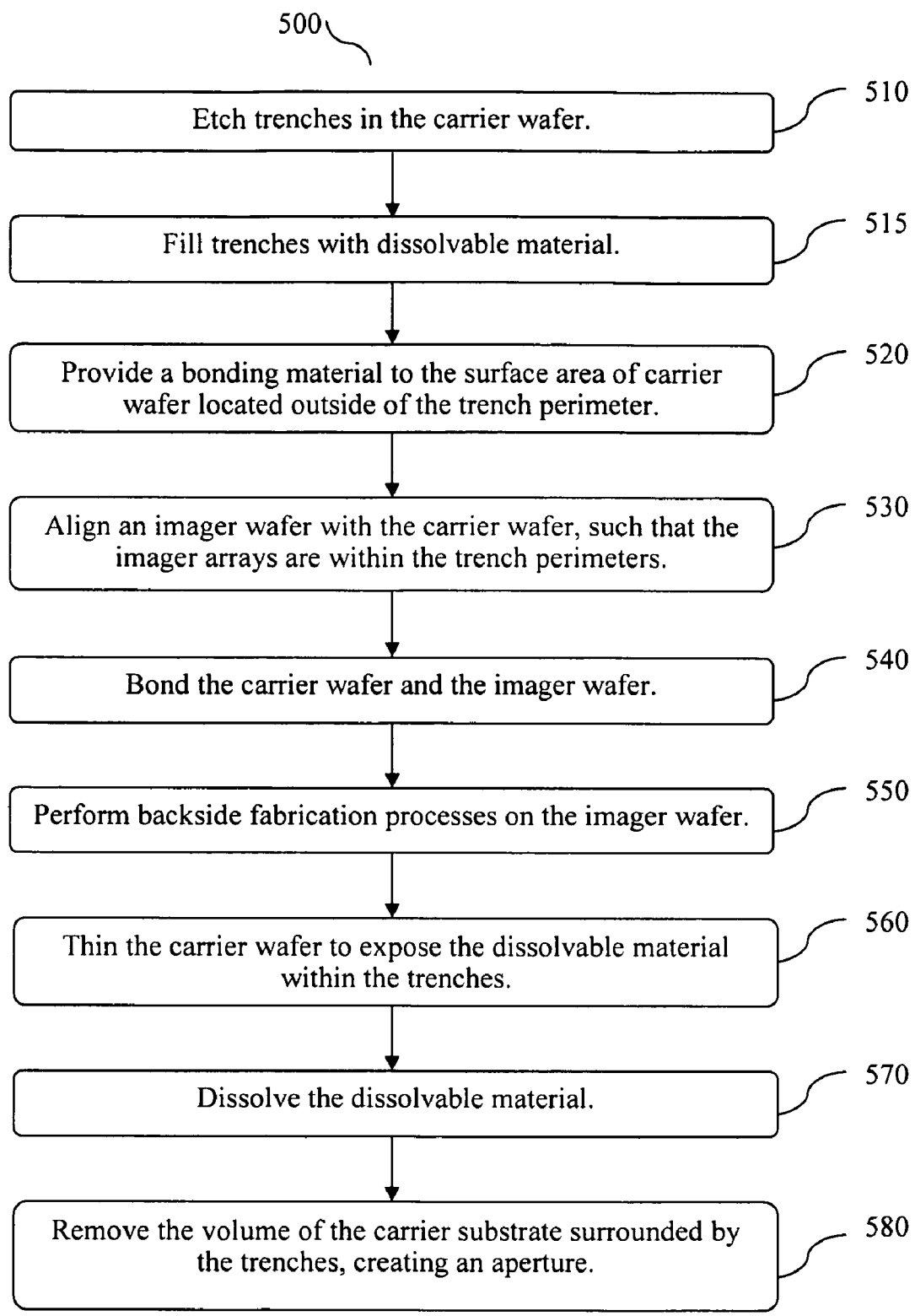
FIG. 5 is a flowchart illustrating a method of forming an imager die with a carrier wafer, in accordance with an embodiment described herein.

The flowchart of FIG. 5 illustrates a method 500 of fabricating an imager die with a carrier wafer, while FIGS. 6A-6J show schematic side cross-sectional views illustrating stages of the method 500. For purposes of simplicity, FIGS. 6A-6J display portions of an imager wafer and a carrier wafer corresponding to a single imager die 650 and a single etched-area 611.

Figure 6A:
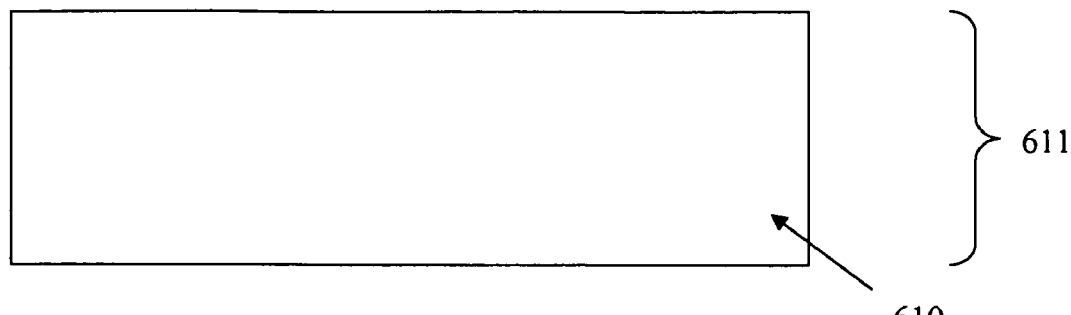
FIGS. 6A-6K show schematic cross-sectional views, displaying a single die area for purposes of simplicity, illustrating stages of a method of forming an imager die with a carrier wafer, in accordance with an embodiment described herein.

FIG. 6A shows a cross-sectional view of a single area 611 of a carrier substrate 610, prior to etching. The area 611 is representative of multiple areas, as would commonly be present on a single carrier wafer prior to etching. The carrier substrate 610 may be made of a semiconductor material, a glass, or other material suitable for bonding to an imager die substrate and for etching and grinding.

Figure 6B:
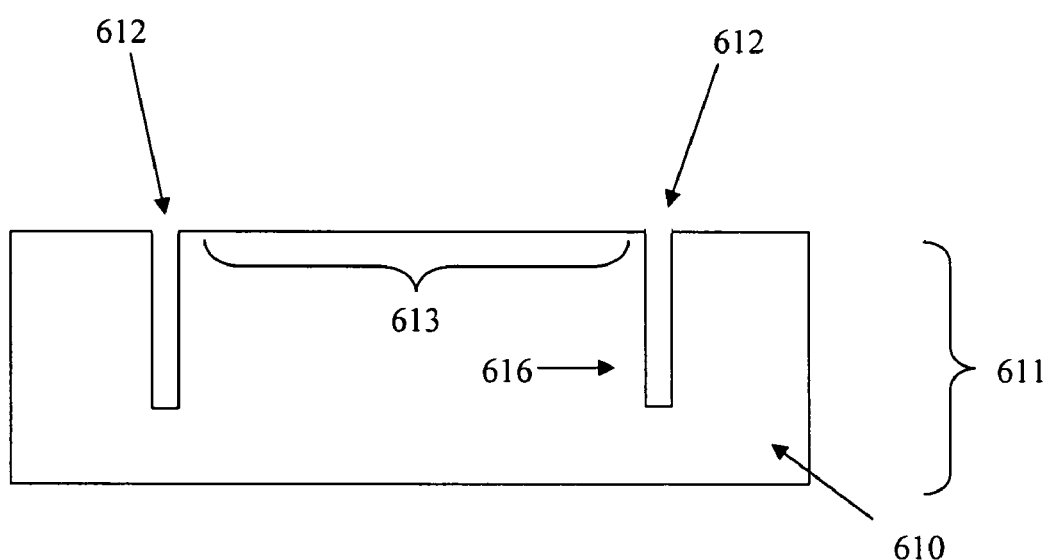

At step 510 of method 500, trenches are etched in the carrier wafer. FIG. 6B shows cross-sectional views of the area 611, after a trench 612 is etched in the carrier substrate 610.

In a desired embodiment, illustrated in FIG. 6B, the trench 612 has a depth that is less than the thickness of the carrier substrate 610. For example, the carrier substrate 610 may have a thickness of 725 microns. The trench 612 may have a depth of approximately 400 to approximately 600 microns. In the same example of the desired embodiment, the trench 612 may also have a width of approximately 50 to approximately 100 microns.

These are merely example dimensions for the trench; it should be appreciated that any trench depth may be suitable for use in the embodiments described herein. For instance, in an alternate embodiment of the etched carrier area 671, illustrated in FIG. 6C, the trench 672 may extend entirely through the carrier substrate 670. If this alternative embodiment of FIG. 6C is employed, a carrier or support, for example an additional carrier wafer, may be used to support the etched carrier wafer until the temporary adhesive material (step 515) is applied.

Figure 6C:
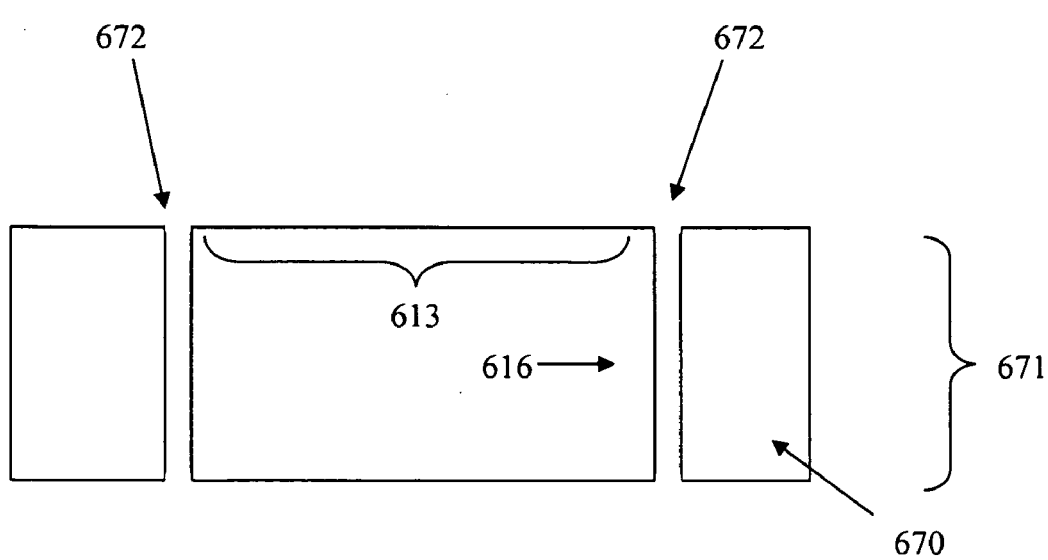

In both the desired embodiment of FIG. 6B and the alternative embodiment of FIG. 6C, the trenches 612, 672 have sidewalls 616 that are preferably, but not necessarily, substantially vertical, and which encircle an inner area 613 of each carrier substrate 610, 670. The trenches may be formed by any of several wet or dry etching methods including, for example, deep reactive-ion etching (DRIE) (including cryogenic or pulsed DRIE). Uniformity of depth and width among each trench 612, 672 on an etched carrier wafer may be desirable in some situations for processing and manufacturing considerations, but is not necessary.

Explanation and illustrations herein discuss the method and structure in terms of the preferred embodiment of the etched carrier wafer, having the etched carrier areas 611 of FIG. 6B. It should be understood, however, that the method would be substantially the same using the alternative embodiment of the etched carrier wafer having an etched area 671 with trenches 672 as shown in FIG. 6C. When using this alternative embodiment, thinning of the carrier wafer (see step 560) is not necessary, but may be desired, as described herein.

Figure 6D:
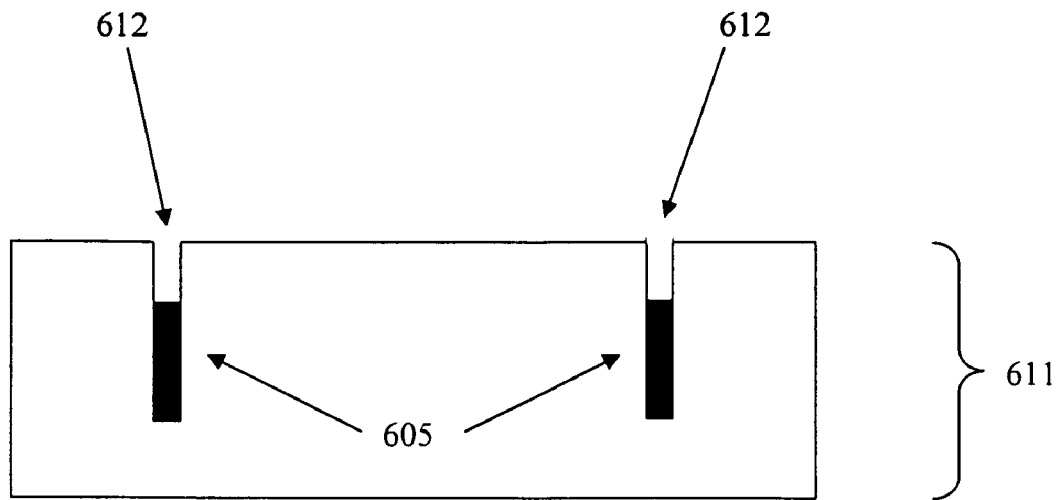

At step 515, the trenches of the etched carrier wafer are filled with a dissolvable material. FIG. 6D illustrates the etched area 611 of the desired embodiment with the dissolvable material 605 partially filling the trench 612. As shown, the dissolvable material 605 need not completely fill the trench 612. The amount of dissolvable material 605 that is desirable for the method 500 will depend upon the properties of the dissolvable material 605, the depth of the trenches, and manufacturing and process considerations; accordingly, embodiments described herein are not be limited to a specific amount of dissolvable material 605.

The dissolvable material 605 should be capable of being removed by known processes. For example, the dissolvable material 605 may be a solvent-soluble temporary adhesive (e.g., WaferBOND™ HT from Brewer Science). Other dissolvable materials may also be used. For example, solvent-soluble masking materials or mounting waxes (e.g., Quick-Stick™ T135 from Electron Microscopy Sciences) may be used. Water-soluble materials may also be used; however water-soluble materials that are soluble in ambient water are generally not desirable, because ambient water is often used when thinning the wafers. Rather, water-soluble thermoplastic adhesive materials, which are not soluble in ambient water yet highly soluble in warm water, may be used (e.g., Opti-tec™ 6000 series from Intertronics).

When filling the trench 612 with the dissolvable material 605, it may be desirable to remove air pockets which may form therein. This can be done through known methods such as, for example, using a vacuum or suction device. It may also be desirable to clean the surface of the carrier wafer subsequent to the application of the temporary material.

Figure 6E:
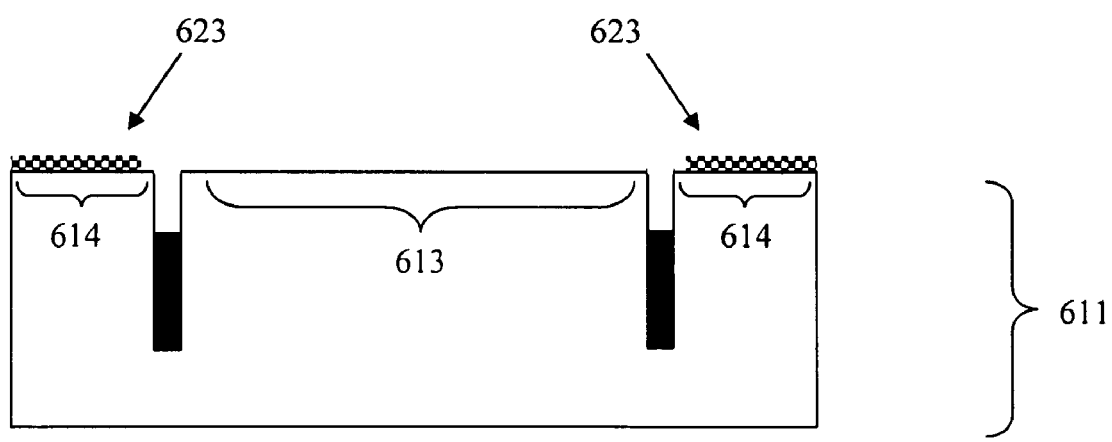

At step 520, a bonding material, for example, an epoxy, is applied to the carrier wafer through one of several known processes, such as, for example, screen printing. As shown in FIG. 6E, the bonding material 623 is applied in a pattern such that the bonding material 623 is only applied to the outer area 614 of the etched area 611. In another embodiment, the bonding material 623 may instead be applied to the imager wafer 650 (see FIG. 6F), in an area outside the imager arrays.

Figure 6F:
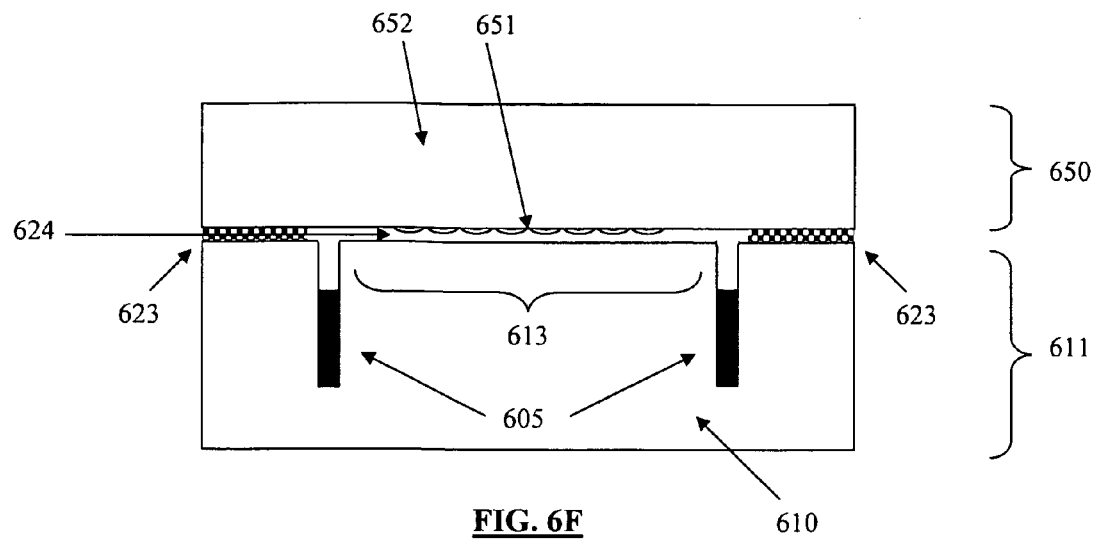

At step 530, the etched carrier wafer is aligned with an imager wafer having a plurality of imager dies. As shown in FIG. 6F, the imager array 651 of each imager die 650 on the imager wafer is aligned within the perimeter of the associated trench 612 in the corresponding etched area 611.

At step 540, the imager wafer and etched carrier wafer are bonded together. The thickness of the bonding material 623 is such that a space 624 exists between the imager array 651 and the opposing surface of the inner area 613 of the etched area 611. The imager array 651 is thus shielded by the etched area 611 from contaminants or particles during the subsequent fabrication processes.

Figure 6G:
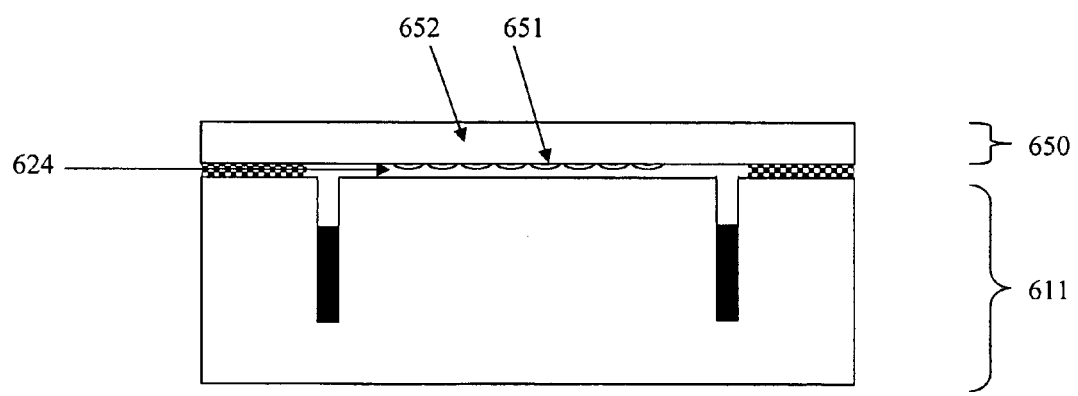

Step 550 includes the performance of all desired backside processes on the imager wafer. These processes may include, but are not limited to, the thinning of the imager substrate 652, as shown in FIG. 6G. The thinning of the imager substrate 652 may be performed through grinding or other known methods. These processes may also include placement of redistribution lines (RDL) (not shown) for each imager die.

Figure 6H:
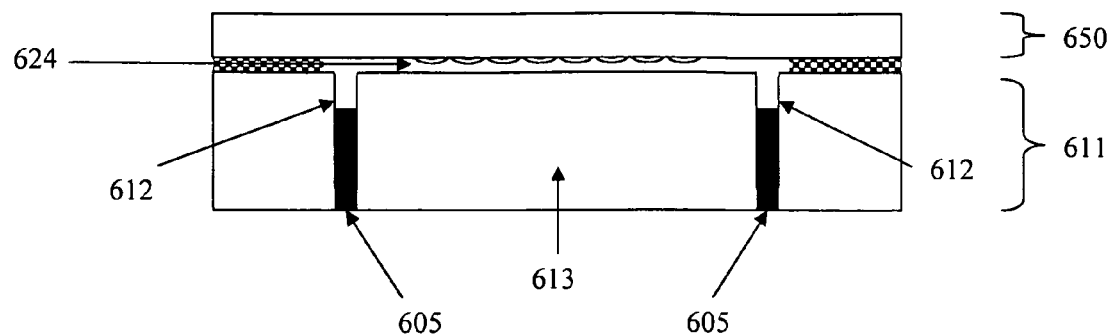

At step 560, the carrier substrate 610 is thinned to expose the bottoms of the trench 612, including part of the dissolvable material 605 in the trench 612. The thinning of the carrier substrate 610 may be done, for example, through grinding or other known methods. The thinning of the carrier substrate 610 may also be conducted antecedent to or simultaneous with the performance of backside processes at step 550. As illustrated in FIG. 6H, the volume 613 within the perimeter of the trench 612 remains in place during this thinning process; thus, reducing or substantially eliminating contamination and damage to the imager array 651 from the carrier substrate thinning process.

Figure 1:
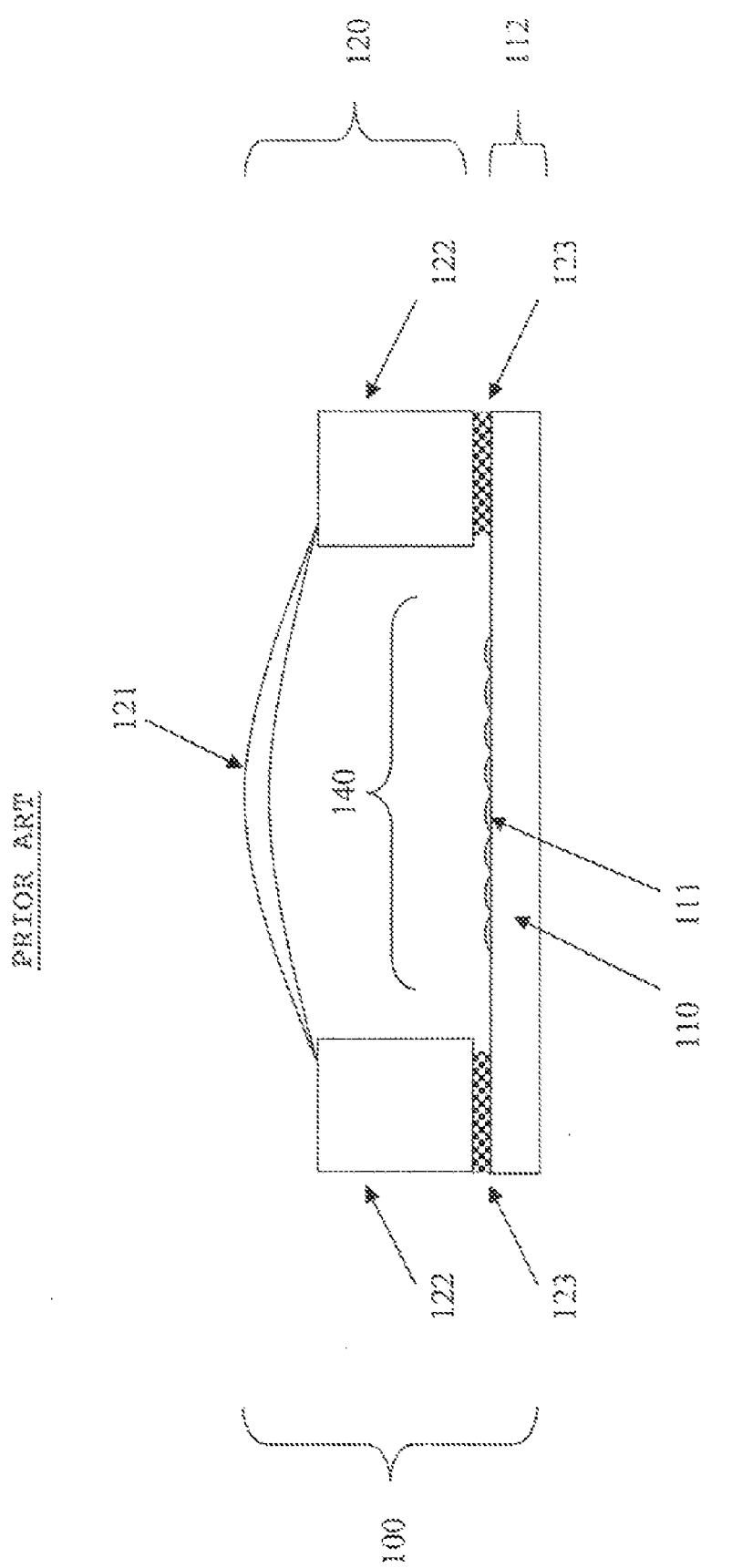
FIG. 1 is a cross section of an imager module.
Figure 2:
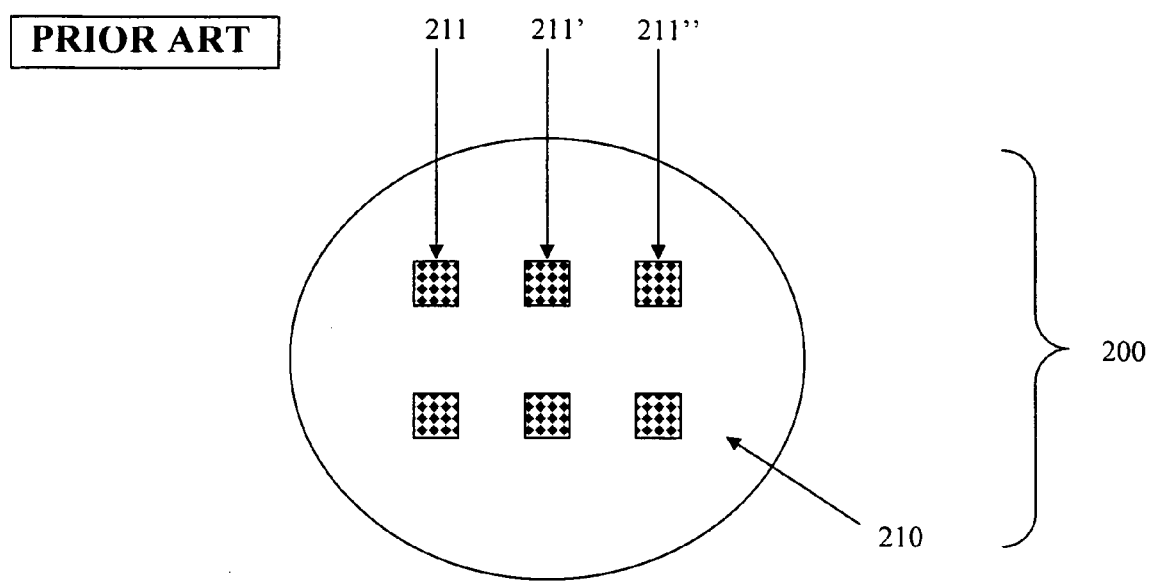
FIG. 2 shows a top view of an imager wafer including multiple imager arrays.
Figure 3A:
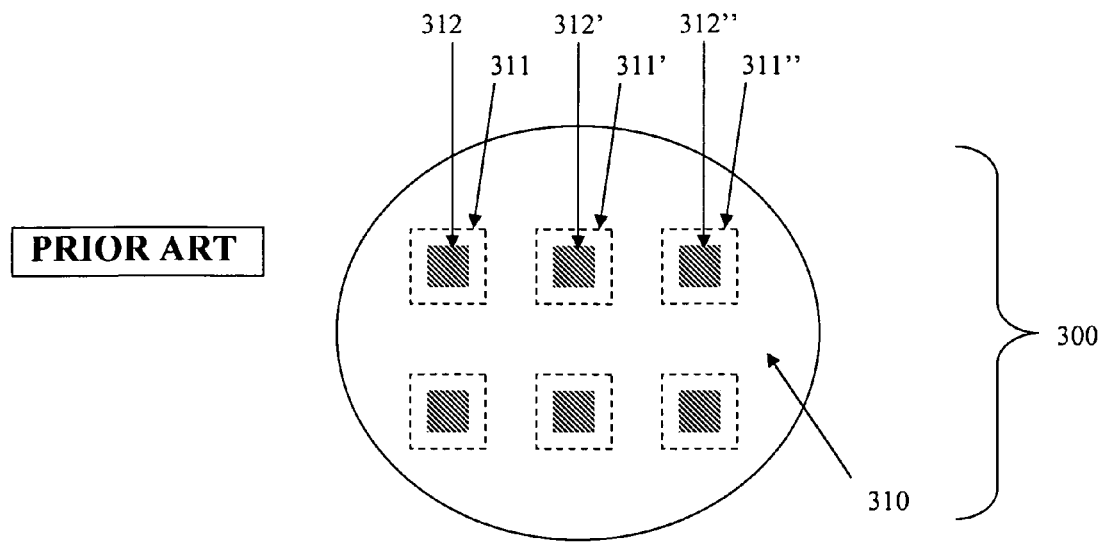
FIG. 3A is a top view of a carrier wafer used to protect the FIG. 2 imager wafer.
Figure 3B:
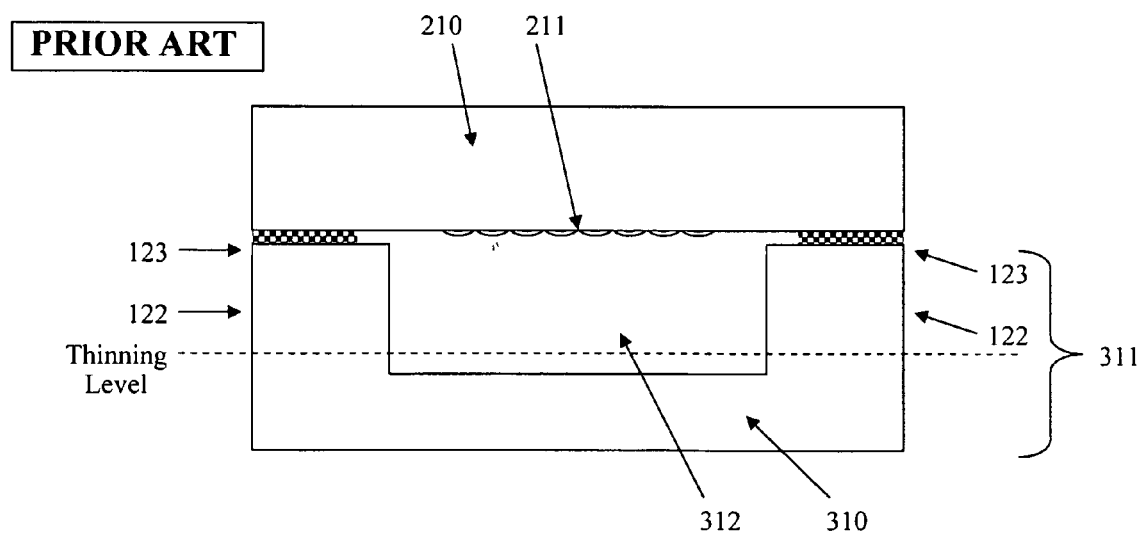
FIG. 3B is a cross-section of a portion of the FIG. 3A carrier wafer as attached to the FIG. 2 imager wafer.

Alternatively, referring back to the alternative embodiment of the etched carrier wafer 671 illustrated in FIG. 6C with trenches 672 extending all the way through the carrier substrate 670, no thinning of the carrier substrate 670 is necessary before removing the dissolvable material. Thus, with the alternative embodiment of the etched carrier area 671, step 560 of FIG. 5 would not be necessary. Thinning of the carrier substrate 670 may still be desired, however, for example to make the carrier substrate 670 the appropriate thickness to act as a spacer wafer 122 (FIG. 1).

Figure 6I:
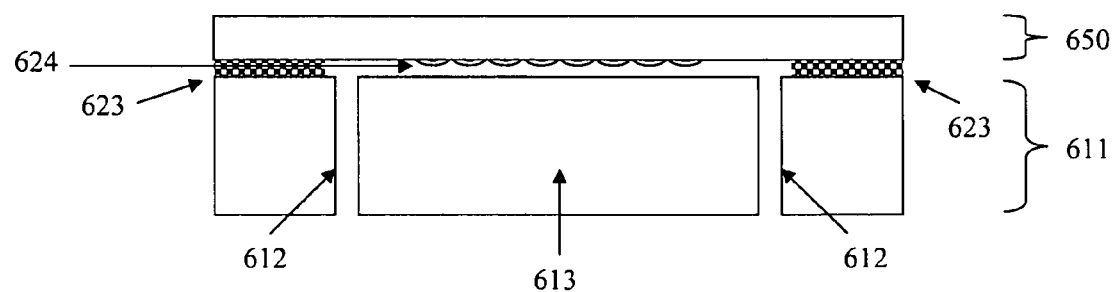

At step 570, the dissolvable material 605 is removed. As shown in FIG. 6I, the volume 613 of the carrier substrate 610 located within the perimeter of each trench 612 is thereby detached. The specific process used to remove the dissolvable material 605 will depend upon the dissolvable material which is used. In a preferred embodiment, a solvent-soluble temporary adhesive used as the dissolvable material 605 can be removed with a solvent, such as acetone.

Figure 6J:
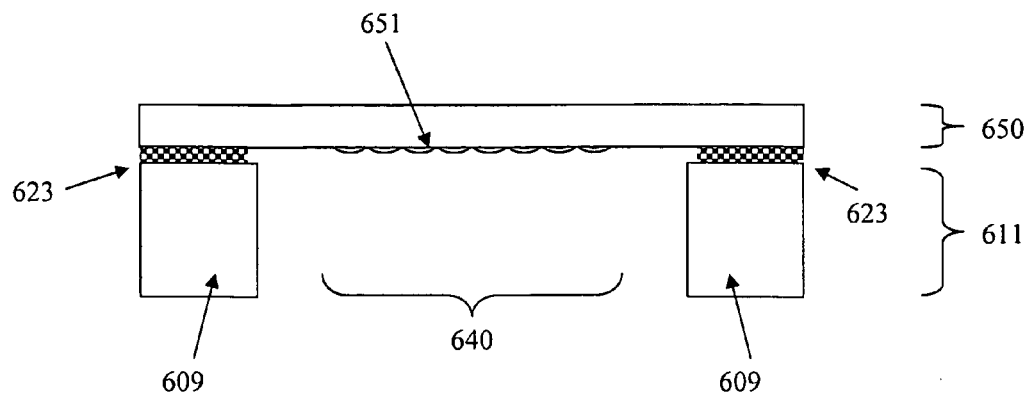

At step 580, once the dissolvable material 605 is removed, the detached volume 613 is allowed to fall away, or may be removed by other means. As shown in FIG. 6J, removal of the volume (no longer shown) creates an aperture 640 through which the imager array 651 is exposed. The aperture 640 is surrounded by remaining carrier substrate 609 left over at each respective etched area 611, which acts as a spacer wafer 122 (FIG. 1). The remaining carrier substrate 609 is bonded to the imager wafer 650 by the bonding material 623.

Figure 6K:
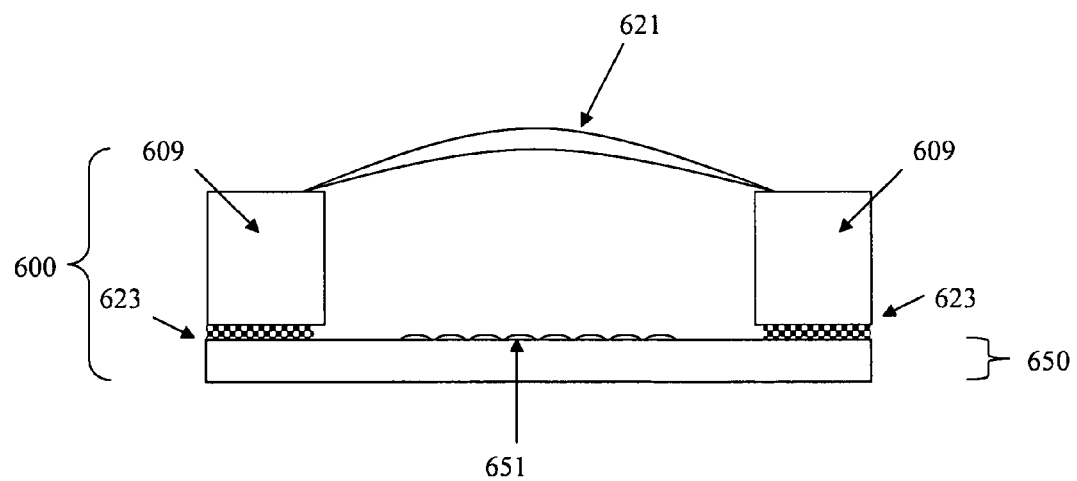

Subsequent to the process described above, other elements may be added to each imager die in order to form complete imager modules 600. As shown in FIG. 6K, at least one lens element 621 is affixed above the imager array 651. The remaining carrier substrate 609 acts as a spacer wafer 122 (FIG. 1) for the imager module 600, maintaining the at least one lens element 621 at a desired distance from the imager array 651, so as to focus light onto the imager array 651.

The above description and drawings illustrate embodiments which achieve the objects, features, and advantages described. Although certain advantages and embodiments have been described above, those skilled in the art will recognize that there may be many others. For example, the steps in the method described in FIG. 5 may be performed in a different order, such as thinning the carrier substrate simultaneously with the imager substrate, or may include some variations, such as alternative materials having similar functions.

What is claimed as new and desired to be protected by Letters Patent of the United States is:

1. A method of forming an imager structure, the method comprising:
   etching trenches in a carrier substrate;
   filling the trenches at least partially with a dissolvable material;
   bonding an imager wafer to the carrier substrate, the imager wafer comprising imager arrays, each imager array being associated with and aligned within a respective trench and being spaced from the carrier substrate; and
   removing the dissolvable material.

2. The method of claim 1, further comprising:
   removing portions of the carrier substrate within the trenches; and
   affixing a lens element above the imager array to the remaining carrier substrate.

3. The method of claim 2, wherein the carrier substrate is thinned to a thickness corresponding to a desired distance between the lens element and the imager array.

4. The method of claim 1, wherein the carrier substrate has a thickness within the range of approximately 650 to approximately 850 microns.

5. The method of claim 1, wherein the trenches have, a width within the range of approximately 50 to approximately 100 microns and have a depth within the range of approximately 400 to approximately 600 microns.

6. The method of claim 1, wherein the step of filling the trenches at least partially with a dissolvable material further comprises removing air pockets within the dissolvable material.

7. The method of claim 1, wherein the dissolvable material is a soluble adhesive.

8. The method of claim 7, wherein the dissolvable material is a solvent-soluble adhesive.

9. The method of claim 7, wherein the dissolvable material is a water-soluble adhesive.

10. A method of forming an imager structure, the method comprising:
    etching trenches in a first wafer, the trenches forming perimeters around inner areas corresponding to imager arrays on an imager wafer;
    placing a dissolvable material in the trenches;
    applying a bonding material to outer areas of at least one of the first wafer and the imager wafer;
    aligning the first wafer and the imager wafer, such that the imager arrays are aligned within the perimeters of the trenches;
    bonding the first wafer and the imager wafer;
    processing a backside of the imager wafer; and
    removing the dissolvable material and portions of the first wafer within a periphery of the trenches.

11. The method of claim 10, wherein the dissolvable material is a solvent-soluble adhesive.

12. The method of claim 10, wherein the dissolvable material is a water-soluble adhesive.

13. The method of claim 10, wherein the trenches are rectangular-shaped.

14. The method of claim 10, wherein the trenches are circular-shaped.

15. The method of claim 10, wherein the trenches have a depth less than a first thickness of the first wafer, and the method further comprises:

thinning the first wafer to a second thickness, the second thickness being less than or equal to the depth of the trenches; and
    attaching respective lens structures to remaining portions of the first wafer at locations corresponding to the imager arrays.

16. A carrier wafer comprising:

a substrate having a thickness;
    a plurality of trenches etched to form perimeters around a plurality of areas on the, substrate, the trenches corresponding to respective perimeters of imager arrays on an imager wafer, the trenches having a depth less than the thickness of the substrate; and
    a dissolvable material within the trenches.

17. The carrier wafer of claim 16, wherein the trenches have a width within the range of approximately 50 microns to approximately 100 microns.

18. The carrier wafer of claim 16, wherein the trenches have a depth within the range of approximately 400 microns to approximately 600 microns.

19. The carrier wafer of claim 16, wherein the trenches are at least partially filled with a solvent-soluble adhesive.

20. An intermediate structure for use in fabrication, the intermediate structure comprising:

a substrate having a thickness; and
    at least one trench etched in the substrate corresponding to a location of a component on a separate structure, the at least one trench encircling a volume of the substrate.

21. The intermediate structure of claim 20, the at least one trench having:

sidewalls that are substantially vertical; and
    a depth less than the thickness of the substrate.

22. The intermediate structure of claim 20, wherein the at least one trench corresponds to a location of an imager array on an imager wafer.

23. The intermediate structure of claim 22, wherein the volume has a surface area corresponding to a surface area of the imager array.

24. The intermediate structure of claim 20, wherein the at least one trench is rectangular-shaped.

25. An intermediate structure for use in imager module fabrication, the intermediate structure comprising:

a substrate having a thickness; and
    at least one trench etched in the substrate, the at least one trench encircling a volume of the substrate, wherein the at least one trench is circular-shaped.

* * * * *